US011224141B2

United States Patent
Shen

(10) Patent No.: US 11,224,141 B2
(45) Date of Patent: Jan. 11, 2022

(54) SERVER RACK SYSTEM AND METHOD OF POWER MANAGEMENT IN THE SERVER RACK SYSTEM

(71) Applicant: MITAC COMPUTING TECHNOLOGY CORPORATION, Taoyuan (TW)

(72) Inventor: Ming-Yen Shen, Taoyuan (TW)

(73) Assignee: MITAC COMPUTING TECHNOLOGY CORPORATION, Taoyuan (TW)

( * ) Notice: Subject to any disclaimer, the term of this patent is extended or adjusted under 35 U.S.C. 154(b) by 178 days.

(21) Appl. No.: 16/829,464

(22) Filed: Mar. 25, 2020

(65) Prior Publication Data
US 2020/0315054 A1 Oct. 1, 2020

(30) Foreign Application Priority Data
Apr. 1, 2019 (TW) .................................. 108111481

(51) Int. Cl.
*G06F 1/28* (2006.01)
*H05K 7/14* (2006.01)

(52) U.S. Cl.
CPC ............. *H05K 7/1492* (2013.01); *G06F 1/28* (2013.01); *H05K 7/1494* (2013.01)

(58) Field of Classification Search
None
See application file for complete search history.

(56) References Cited

U.S. PATENT DOCUMENTS

| 11,048,320 | B1* | 6/2021 | Sukumaran | ............... G06F 1/28 |
| 2003/0065958 | A1* | 4/2003 | Hansen | ..................... G06F 1/26 713/300 |
| 2005/0055587 | A1* | 3/2005 | Lee | .......................... G06F 1/28 713/300 |
| 2006/0184287 | A1* | 8/2006 | Belady | ................... G06F 1/3275 700/291 |
| 2007/0150757 | A1* | 6/2007 | Aldereguia | ........... G06F 1/3209 713/300 |
| 2011/0035533 | A1* | 2/2011 | Doh | ...................... G06F 1/3287 711/102 |

(Continued)

FOREIGN PATENT DOCUMENTS

TW 201702799 A 1/2017

OTHER PUBLICATIONS

Search Report appended to an Office Action, which was issued to Taiwanese counterpart application No. 108111481 by the TIPO dated Apr. 29, 2020, with an English translation thereof.

*Primary Examiner* — Danny Chan
(74) *Attorney, Agent, or Firm* — Lewis Roca Rothgerber Christie LLP

(57) ABSTRACT

A server rack system includes a plurality of servers, a plurality of power supply units for supplying power to the servers, and a microcontroller electrically connected to the servers and the power supply units. The microcontroller is configured to determine a number of those of the servers that are currently in operation, compare the number with a critical value, determine whether each of the power supply units operates normally, and control at least one of the servers that are currently in operation to operate at a lower operating frequency when the number is greater than the critical value and at least one of the power supply units operates abnormally.

20 Claims, 4 Drawing Sheets

(56) References Cited

U.S. PATENT DOCUMENTS

| | | | |
|---|---|---|---|
| 2011/0252254 A1* | 10/2011 | Kameda | G06F 1/32 |
| | | | 713/320 |
| 2015/0192979 A1* | 7/2015 | Ghose | G06F 9/4893 |
| | | | 713/320 |
| 2017/0010652 A1* | 1/2017 | Huang | G06F 11/0751 |
| 2017/0208121 A1* | 7/2017 | Granshaw | G06F 9/5061 |

* cited by examiner

SERVER RACK SYSTEM AND METHOD OF POWER MANAGEMENT IN THE SERVER RACK SYSTEM

CROSS-REFERENCE TO RELATED APPLICATION

This application claims priority of Taiwanese Patent Application No. 108111481, filed on Apr. 1, 2019.

FIELD

The disclosure relates to a method of power management, and more particularly to a method of power management in a server rack system.

BACKGROUND

A conventional server rack system includes a plurality of servers (i.e., server nodes) and a plurality of power supply units. The power supply units receive alternating current (AC) mains electricity, covert the AC mains electricity into direct-current (DC) output current, and provides the DC output current to the servers.

In the conventional server rack system, when at least one of the power supply units is damaged, though the rest of the power supply units that are operating normally may keep providing the DC output current to the servers, one or more of the servers may crash or shut down when a sum of the power consumed by the servers is greater than the combined rated output power of the rest of the power supply units. The crashing or shutting down of the servers may result in information loss or damage.

SUMMARY

Therefore, an object of the disclosure is to provide a server rack system and a method of power management in the server rack system that can alleviate at least one of the drawbacks of the prior art.

According to one aspect of the disclosure, a server rack system may include a plurality of servers, a plurality of power supply units for supplying power to the servers, and a microcontroller electrically connected to the servers and the power supply units. The microcontroller is configured to determine a number of those of the servers that are currently in operation, compare the number of those of the servers that are currently in operation with a critical value, determine whether each of the power supply units operates normally, and control at least one of those of the servers that are currently in operation to operate at a lower operating frequency when the number of those of the servers that are currently in operation is greater than the critical value and at least one of the power supply units operates abnormally.

According to another aspect of the disclosure, the method of power management in the server rack system includes steps of determining a number of those of the servers that are currently in operation, comparing the number of those of the servers that are currently in operation with a critical value, determining whether each of the power supply units operates normally, and controlling at least one of those of the servers that are currently in operation to operate at a lower operating frequency when the number of those of the servers that are currently in operation is greater than the critical value and at least one of the power supply units operates abnormally.

BRIEF DESCRIPTION OF THE DRAWING

Other features and advantages of the disclosure will become apparent in the following detailed description of the embodiments with reference to the accompanying drawing, of which.

DETAILED DESCRIPTION

Figure 1:
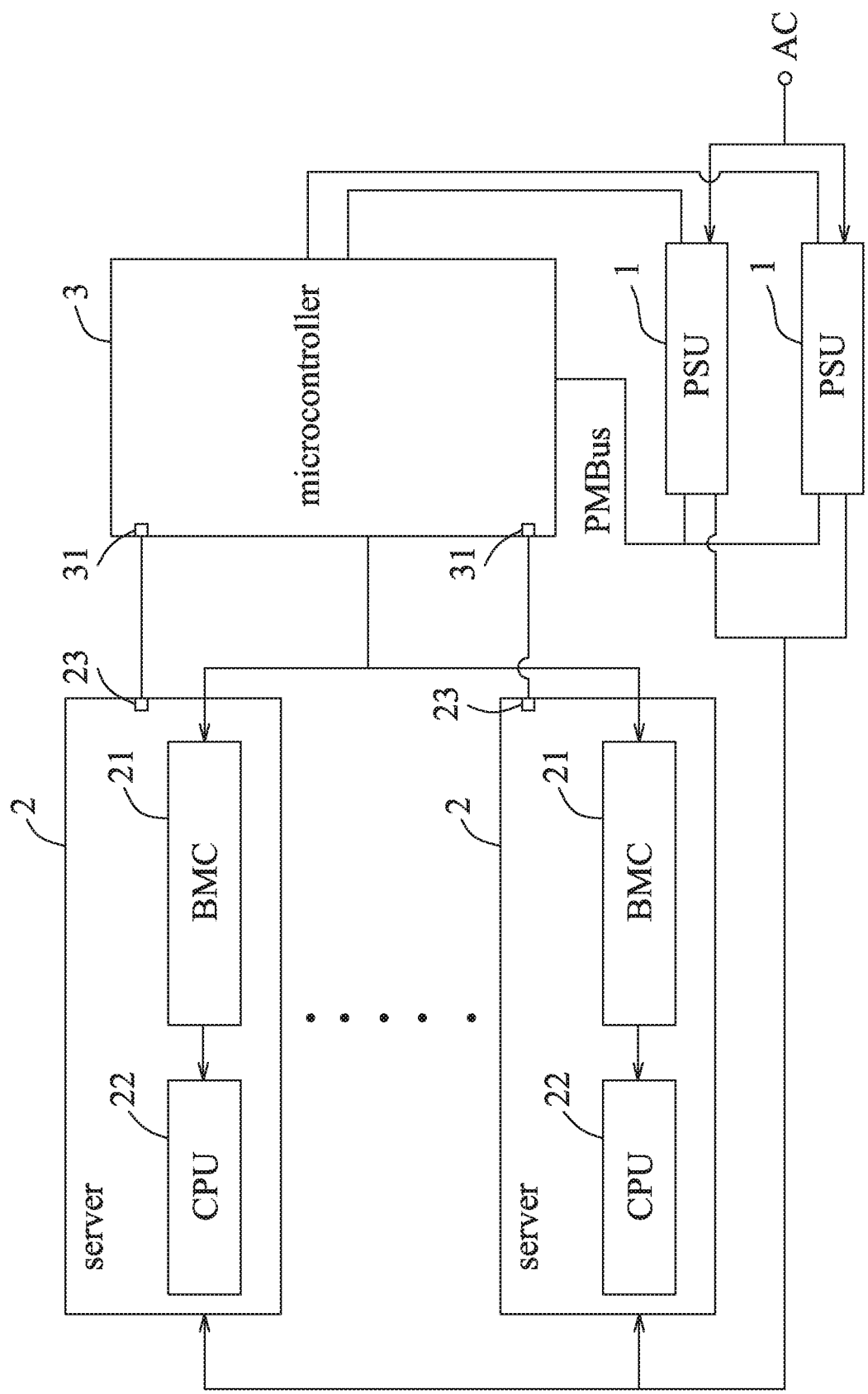
FIG. 1 is a block diagram illustrating an embodiment of a server rack system according to the disclosure.

Referring to FIG. 1, an embodiment of a server rack system 100 includes a plurality of servers 2 (i.e., nodes), a plurality of power supply units 1 (PSU) for supplying power to the servers 2, and a microcontroller 3 electrically connected to the servers 2 and the power supply units 1. The power supply units 1, the servers 2 and the microcontroller 3 are all mounted on a rack (not shown). In this embodiment, the server rack system 100 is a 2U 4-Node system, which means that there are two power supply units 1 and four servers 2 in the system. In other embodiments, the server rack system 100 may be a 3U 8-Node system, a 4U 8-Node system, etc.

The power supply units 1 may receive external power, (e.g., alternating-current (AC) mains electricity), convert it into direct-current (DC) output current, and provide the DC output current to the servers 2. Each of the power supply units 1 has a presence pin (not shown). For each power supply unit 1, once the power supply unit 1 is installed properly, the presence pin is conducted, and a presence signal is transmitted to the microcontroller 3 via the presence pin.

In this embodiment, the server rack system 100 further includes a power management bus (PMBus), and the power supply units 1 are electrically connected to the microcontroller 3 via the PMBus. The PMBus allows the microcontroller 3 to manage the power supply units 1, and is configured to output a notification signal to the microcontroller 3 periodically. The notification signal may indicate an operating status and rated output power of each of the power supply units 1.

Each of the servers 2 has a baseboard management controller (BMC) 21 for communicating with the microcontroller 3, and a central processing unit (CPU) 22 electrically connected to the BMC 21. When the server 2 is active, the server 2 is provided with an operating power from the power supply units 1 and functions normally. On the other hand, when the server 2 is not active, the power supply units 1 still supply a standby power (less than the operating power) to the server 2. Further, when the server 2 is totally off, neither the standby power nor the operating power would be supplied to the server 2.

In this embodiment, each of the servers 2 further includes a detection module 23 having circuits (not shown) such as a pull-high circuit, a pull-low circuit, a heart beat circuit that is coupled to the heart beat pin of the CPU, and a switch circuit such as bipolar junction transistor (BJT), etc. In other embodiments, the detection module 23, rather than being mounted in the server 2, is mounted at a backboard where the microcontroller 3 is mounted at.

The microcontroller 3 has general-purpose input/output (GPIO) interfaces 31. Each GPIO interface 31 has a plurality of GPIO pins (not shown), and is electrically connected to the detection module 23 of a respective one of the servers 2. Each detection module 23 receives operating power and is configured to be triggered by the operating power to output voltage signals respectively through, for example, two of the GPIO pins (GPIO_0, GPIO_1). The voltage signals when viewed as a whole serve as an indicating signal, and the indicating signal is received by the microcontroller 3. The microcontroller 3 determines that the server 2 is currently in operation upon receipt of the indicating signal. To wit, if a server 2 is powered and functions normally, the microcontroller 3 would receive the indicating signal from the server 2, and may accordingly determine that the server 2 is currently in operation. On the other hand, if a server 2 is not active (not powered or is functioning abnormally), its detection module 23 is not triggered to output the voltage signals, and the microcontroller 3 would fail to receive the indicating signal from the server 2 and may determine that the server 2 is currently not in operation.

Specifically, upon receipt of an indicating signal, the microcontroller 3 may further identify which one of the servers 2 is currently in operation by referring to a lookup table (LUT). As an example, when the microcontroller 3 receives an indicating signal consisting of the voltage signal at the GPIO pin (GPIO_0) having a logic level "0" (i.e., logic low) and the voltage signal at the GPIO pin (GPIO_1) having a logic level "1" (i.e., logic high), the microcontroller 3 identifies the server 2 accordingly.

In other embodiments, each of the servers 2 has a connector module (not shown) with a pin connected to the microcontroller 3 and coupled to the detection module 23 of the server 2 for providing the indicating signal to the microcontroller 3 when the server 2 is active and the detection module 23 is triggered by the operating power.

In some embodiments, each of the servers 2 has an Inter-Integrated Circuit Bus (I²C Bus) (not shown) connected to the microcontroller 3 for providing the indicating signal to the microcontroller 3 when the server 2 is active, and the I²C Bus is triggered by the operating power.

Figure 2:
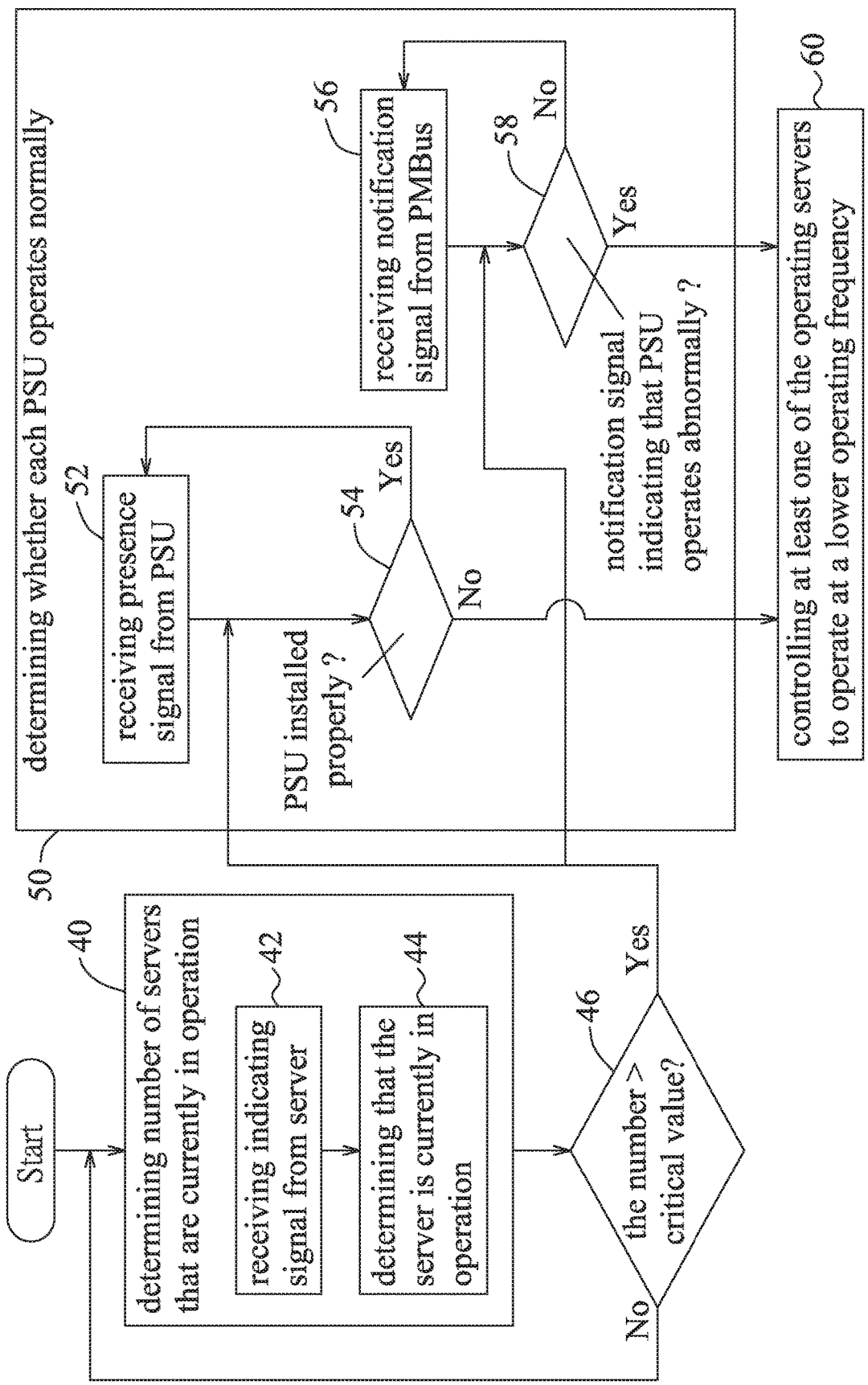
FIG. 2 is a flow chart exemplarily illustrating a method of power management in a server rack system according to an embodiment of the disclosure.

Referring to FIG. 2, a method of power management in the server rack system 100 according to one embodiment includes the following steps. First, in step 40, the microcontroller 3 determines a number of those of the servers 2 that are currently in operation (referred to as operating servers hereinafter). Specifically, for each of the servers 2, when it is powered and functions normally, the corresponding indicating signal is generated and transmitted to the microcontroller 3. The microcontroller 3 receives the indicating signal (sub-step 42), and determines that the server 2 is currently in operation in response to receipt of the indicating signal (sub-step 44). The number of operating servers 2 can be determined accordingly.

In the meantime, in step 50, the microcontroller 3 determines whether each of the power supply units 1 operates normally. Specifically, the microcontroller 3 receives the presence signals respectively from those of the power supply units 1 that are installed properly (sub-step 52), and receives the notification signal from the PMBus indicating the operating status and the rated output power of each of the power supply units 1 (sub-step 56).

Turning to step 46, in step 46, the microcontroller 3 compares the number of operating servers 2 with a critical value. In this embodiment, the critical value is a default value of, for example, "two." If the number of operating servers 2 is greater than the critical value, the microcontroller 3 further performs sub-step 54 of step 50 to determine whether the power supply units 1 are installed properly based on the presence signals from those of the power supply units 1 that are installed properly, and performs sub-step 58 of step 50 to determine whether each of the power supply units 1 operates normally based on the notification signal. If any one of the power supply units 1 is not installed properly, or if the notification signal indicates that any one of the power supply units 1 operates abnormally, then the microcontroller 3 performs step 60. Further, in another embodiment, the step of determining whether each of the power supply units 1 operates normally may be performed by simply determining whether the power supply unit 1 outputs electric power.

In step 60, the microcontroller 3 controls at least one of the operating servers 2 to operate at a lower operating frequency. In detail, the microcontroller 3 asks the BMC 21 of said at least one of the operating servers 2 to generate a control instruction to the corresponding CPU 22 in order to make the CPU 22 operate at the lower operating frequency. The CPU 22 then operates at the lower operating frequency according to the control instruction. In an embodiment, the microcontroller 3 controls all of the operating servers 2 to operate at the lower operating frequency in step 60. It should be noted that the term "lower operating frequency" throughout the disclosure means an operating frequency lower than a normal operating frequency of each server 2 when operating at full speed.

According to this embodiment, if the number of operating servers 2 is less than the critical value, none of sub-step 54, sub-step 58 and step 60 is implemented. Once the number of operating servers 2 is greater than the critical value, a checking mechanism is triggered for checking whether each of the power supply units 1 operates normally. If all of the power supply units 1 operate normally, none of the operating servers 2 is controlled to operate at the lower operating frequency. If any one of the power supply units 1 operates abnormally, at least one of the operating servers 2 is controlled to operate at the lower operating frequency. In this way, none of the operating servers 2 may crash or shut down due to power overload that may be attributed to abnormal operation of the power supply units 1.

When those of the power supply units 1 that are installed improperly are re-installed, or those that operate abnormally are replaced, the microcontroller 3 may be triggered to output a reinstating instruction to those of the servers 2 that operate at the lower operating frequency to control the same to operate at full speed.

It is noted that, in another embodiment, rather than a default value, the critical value may be determined based on a sum of the rated output power of those of the power supply units 1 that operate normally, or based on a power supply ratio. The power supply ratio may be a ratio of a number of those of the power supply units 1 that operate normally to a total number of the power supply units 1, or a ratio of the sum of the rated output power of those of the power supply units 1 that operate normally to a total rated output power (a sum of the rated output power that defined by the specification of each power supply unit 1) of all of the power supply units 1.

Figure 3:
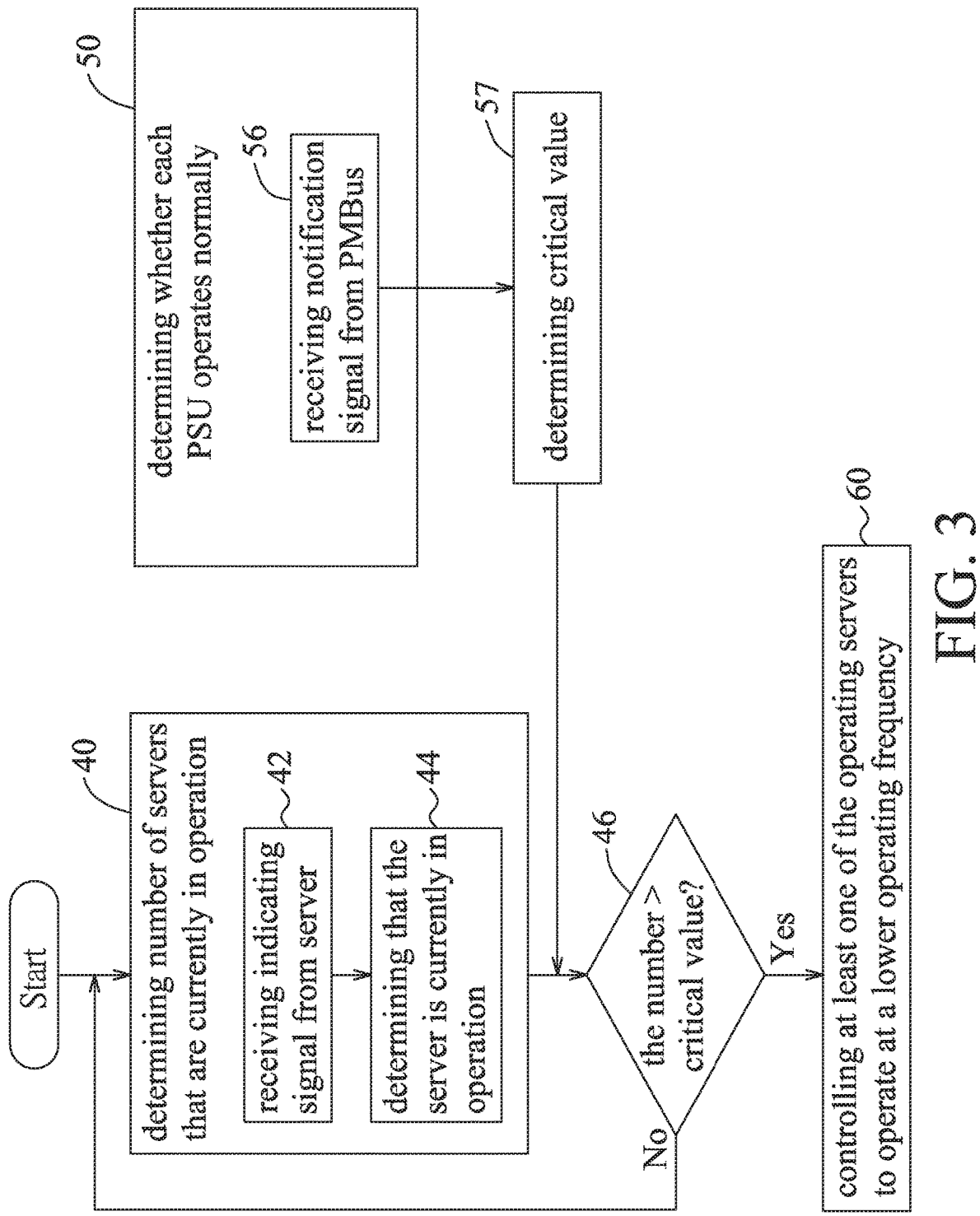
FIG. 3 is a flow chart exemplarily illustrating a method of power management in a server rack system according to another embodiment of the disclosure.

Referring to FIG. 3, in the case that the critical value is determined based on the ratio of the sum of the rated output power of those of the power supply units 1 that operate normally to the total rated output power of all of the power supply units 1 installed in the server rack system 100, the process of the method of power management in the server rack system 100 may be simplified according to one embodiment of this disclosure. It should be noted that, in this embodiment, the server rack system 100 is a 2U 4-Node system, i.e., the total number of the power supply units 1 would be two.

In detail, after receiving from the PMBus the notification signal indicating the operating status and the rated output power of each of the power supply units 1 (sub-step 56 of step 50), the microcontroller 3 further determines the critical value (step 57). Specifically, other sub-steps of step 50, namely sub-steps 52, 54 and 58, may be omitted. In some embodiments, the total rated output power of all of the power supply units 1 may be a default value, and is obtained in advance by the microcontroller 3. Alternatively, the microcontroller 3 may read the total rated output power of all of the power supply units 1 via the PMBus when the server rack system 100 is booted up. Further, the microcontroller 3 may be informed of the rated output power of each of those of the power supply units 1 that are operating normally based on the notification signal. The microcontroller 3 then calculates the power supply ratio, and determines the critical value based on the power supply ratio. For example, if the power supply ratio is 50%, the critical value may be determined by multiplying four (i.e., a total number of the servers 2 installed in the server rack system 100) by the power supply ratio 50% and the result is "two." In step 46, the microcontroller 3 compares the number of operating servers 2 with the critical value. If the number of operating servers 2 is greater than the critical value, the microcontroller 3 performs step 60 to control at least one of the operating servers 2 to operate at a lower operating frequency.

In other words, when any one of the power supply units 1 operates abnormally, the critical value calculated according to the method of FIG. 3 is decreased, and the decrease of the critical value may affect a result of determination in step 46. With a decreased critical value, it is more likely that the number of operating servers 2 is greater than the critical value, and thus at least one of the operating server 2 is controlled to operate at the lowering operating frequency, thereby preventing the operating servers 2 from crashing or shutting down.

Figure 4:
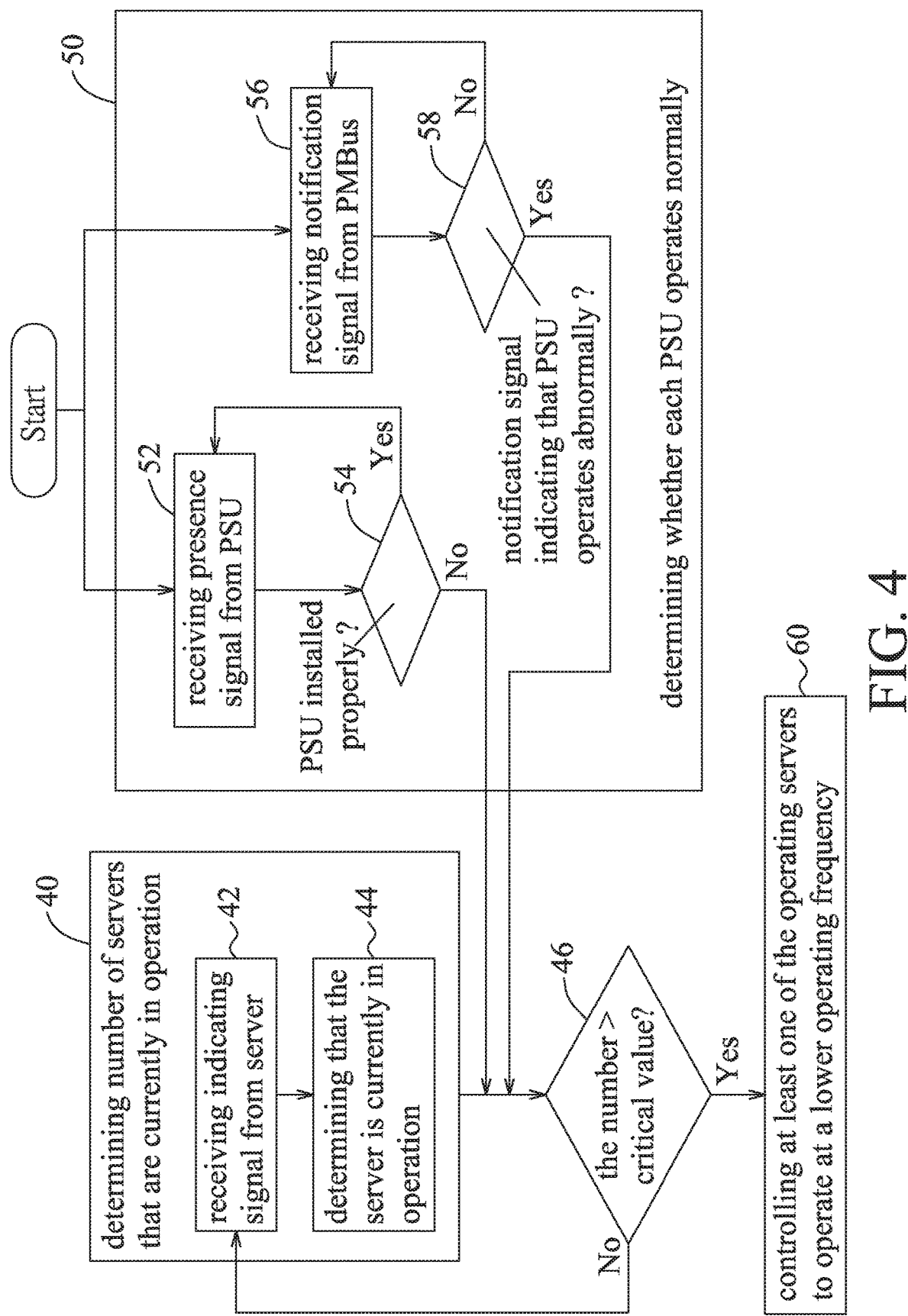
FIG. 4 is a flow chart exemplarily illustrating a method of power management in a server rack system according to yet another embodiment of the disclosure.

Referring to FIG. 4, according to another embodiment, the sequence of the determinations made in steps 46 and 50 may interchange. In this embodiment, the microcontroller 3 determines whether each of the power supply units 1 operates normally (step 50) first. Once any one of the power supply units 1 is determined as having been installed improperly or as operating abnormally, the microcontroller 3 further compares the number of operating servers 2 with the critical value (step 46). That is to say, step 46 of comparing the number of operating servers 2 with the critical value is implemented only when it is determined that at least one of the power supply units 1 operates abnormally in step 50.

Further, it should be noted that, the microcontroller 3 could be set up as a standalone device. In some embodiments, one of the servers 2 serves as a master server, and the microcontroller 3 is integrated into the master server.

In view of the above, when at least one of the power supply units 1 is damaged, none of the servers 2 would crash or shut down even if the total power consumption of the servers 2 is greater than a sum of the rated output power of the rest (non-damaged) of the power supply units 1.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that the disclosure is not limited to the disclosed embodiment but is intended to cover various arrangements included within the spirit and scope of the broadest interpretation so as to encompass all such modifications and equivalent arrangements.

What is claimed is:

1. A method of power management in a server rack system that includes a microcontroller, a plurality of servers and a plurality of power supply units for supplying power to the servers, the method comprising steps of:
    determining, by the microcontroller, a number of those of the servers that are currently in operation;
    comparing, by the microcontroller, the number of those of the servers that are currently in operation with a critical value;
    determining, by the microcontroller, whether each of the power supply units operates normally, and
    controlling, by the microcontroller, at least one of those of the servers that are currently in operation to operate at a lower operating frequency when the number of those of the servers that are currently in operation is greater than the critical value and at least one of the power supply units operates abnormally.

2. The method of claim 1, wherein the step of determining a number of those of the servers that are currently in operation includes, for each of the servers, determining that the server is currently in operation when the microcontroller receives an indicating signal from the server.

3. The method of claim 1, wherein the step of determining whether each of the power supply units operates normally includes:
    determining that the power supply unit is installed properly when a presence signal is received from a presence pin of the power supply unit; and
    determining that the power supply unit operates abnormally when it is determined by the microcontroller that the power supply unit is not installed properly.

4. The method of claim 1, wherein the step of determining whether each of the power supply units operates normally is to determine whether the power supply unit outputs electric power.

5. The method of claim 1, the server rack system further including a power management bus (PMBus) that is electrically connected between each of the power supply units and the microcontroller, wherein the step of determining whether each of the power supply units operates normally includes:
    receiving, from the PMBus, a notification signal indicating an operating status of each of the power supply units; and
    determining whether each of the power supply units operates normally based on the notification signal.

6. The method of claim 5, wherein the notification signal indicates a rated output power of each of the power supply units;

wherein, before the step of comparing the number of those of the servers that are currently in operation with the critical value, the microcontroller determines a power supply ratio which is a ratio of a sum of the rated output power of those of the power supply units that operate normally to a sum of the rated output power of all of the power supply units, and determines the critical value based on the power supply ratio.

7. The method of claim 1, further comprising, before the step of comparing the number of those of the servers that are currently in operation with a critical value, steps of:

determining, by the microcontroller, a power supply ratio which is one of a ratio of a number of those of the power supply units that operate normally to a total number of the power supply units, and a ratio of a sum of rated output powers of those of the power supply units that operate normally to a total rated output power of all of the power supply units; and determining, by the microcontroller, the critical value based on the power supply ratio.

8. The method of claim 1, further comprising, before the step of comparing the number of those of the servers that are currently in operation with a critical value, a step of: determining, by the microcontroller, the critical value based on a sum of rated output power of those of the power supply units that operate normally.

9. The method of claim 1, wherein the step of determining whether each of the power supply unit operates normally is implemented only when it is determined that the number of those of the servers that are currently in operation is greater than the critical value.

10. The method of claim 1, wherein the step of comparing the number of those of the servers that are currently in operation with the critical value is implemented only when it is determined that at least one of the power supply units operates abnormally.

11. A server rack system comprising:
a plurality of servers;
a plurality of power supply units for supplying power to said servers; and
a microcontroller electrically connected to said servers and said power supply units, and configured to
determine a number of those of said servers that are currently in operation,
compare the number of those of said servers that are currently in operation with a critical value,
determine whether each of said power supply units operates normally, and
control at least one of said servers that are currently in operation to operate at a lower operating frequency when the number of those of said servers that are currently in operation is greater than the critical value and at least one of said power supply units operates abnormally.

12. The server rack system of claim 11, wherein said microcontroller is configured to determine the number of those of said servers that are currently in operation by, for each of said servers, determining that said server is currently in operation upon receiving an indicating signal from said server.

13. The server rack system of claim 11, wherein each of said power supply units has a presence pin, and said microcontroller is configured to determine whether each of said power supply units operates normally by:

determining that said power supply unit is installed properly when a presence signal is received from said presence pin of said power supply unit; and determining that said power supply unit operates abnormally when it is determined that said power supply unit is not installed properly.

14. The server rack system of claim 11, wherein said microcontroller is configured to determine whether each of said power supply units operates normally by determining whether said power supply unit outputs electric power.

15. The server rack system of claim 11, further comprising a power management bus (PMBus) electrically connected between said microcontroller and each of said power supply units, and configured to output a notification signal to said microcontroller, the notification signal indicating an operating status and rated output power of each of said power supply units;

wherein said microcontroller is configured to determine whether each of said power supply units operates normally based on the notification signal.

16. The server rack system of claim 11, wherein said microcontroller is further configured to, before comparing the number of those of said servers that are currently in operation with the critical value:

determine a power supply ratio which is one of a ratio of a number of those of said power supply units that operate normally to a total number of said power supply units, and a ratio of a sum of rated output power of those of said power supply units that operate normally to a total rated output power of all of said power supply units; and determine the critical value based on the power supply ratio.

17. The server rack system of claim 11, wherein said microcontroller is further configured to, before comparing the number of those of said servers that are currently in operation with the critical value, determine the critical value based on a sum of rated output power of those of said power supply units that operate normally.

18. The server rack system of claim 11, wherein said microcontroller is configured to determine whether each of said power supply unit operates normally only when it is determined thereby that the number of those of said servers that are currently in operation is greater than the critical value.

19. The server rack system of claim 11, wherein said microcontroller is configured to compare the number of those of said servers that are currently in operation with the critical value only when it is determined that at least one of said power supply units operates abnormally.

20. The server rack system of claim 11, wherein one of said servers is a master server, and said microcontroller is integrated in said master server.

* * * * *